United States Patent
Hill et al.

(10) Patent No.: US 6,368,929 B1
(45) Date of Patent: Apr. 9, 2002

(54) METHOD OF MANUFACTURING A SEMICONDUCTOR COMPONENT AND SEMICONDUCTOR COMPONENT THEREOF

(75) Inventors: Darrell G. Hill, Tempe; Mariam G. Sadaka, Phoenix; Jonathan K. Abrokwah, Chandler, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/641,002

(22) Filed: Aug. 17, 2000

(51) Int. Cl.[7] .............................................. H01L 21/331
(52) U.S. Cl. ..................... 438/312; 438/309; 438/375
(58) Field of Search ................................ 438/312, 345, 438/375

(56) References Cited

U.S. PATENT DOCUMENTS

| | | | |
|---|---|---|---|
| 4,839,303 A | 6/1989 | Tully et al. ................ | 437/31 |
| 4,954,457 A | 9/1990 | Jambotkar ................. | 437/31 |
| 5,001,534 A | 3/1991 | Lunardi et al. ............ | 357/34 |
| 5,019,524 A | 5/1991 | Mitani et al. ............. | 437/31 |
| 5,264,379 A | 11/1993 | Shikata .................... | 437/31 |
| 5,272,095 A * | 12/1993 | Enquist et al. ............ | 438/320 |
| 5,448,087 A | 9/1995 | Streit et al. ............... | 257/198 |
| 5,683,919 A | 11/1997 | Tserng ...................... | 437/31 |
| 5,702,958 A | 12/1997 | Liu et al. .................. | 437/31 |
| 5,710,068 A | 1/1998 | Hill ..................... | 437/415 M |
| 5,717,231 A | 2/1998 | Tserng et al. ............. | 257/276 |
| 5,757,039 A | 5/1998 | Delaney et al. ........... | 257/198 |
| 5,804,877 A | 9/1998 | Fuller et al. .............. | 257/745 |
| 5,840,612 A | 11/1998 | Oki et al. ................. | 438/312 |
| 6,037,616 A * | 3/2000 | Amamiya .................. | 257/198 |

FOREIGN PATENT DOCUMENTS

| | | | |
|---|---|---|---|
| JP | 03236224 A | * | 10/1991 |
| JP | 04722 A | * | 1/1992 |
| JP | 052754444 A | * | 10/1993 |
| JP | 2000260975 A | * | 9/2000 |

OTHER PUBLICATIONS

Wolf, S.; Silicon Processing for the VLSI Era Volume 2: Process Integration, Sunset Beach, CA, 1990, p.p. 486–488.*

H. Lin et al., "Super–gain AlGaAs/GaAs heterojunction bipolar transistors using an emitter edge–thinning design", American Institute of Physics, Appl. Phys. Letter 47 (8), Oct. 15, 1985, pp. 839–841.

W. Lee et al., "Effect of Emitter–Base Spacing on the Current Gain of AlGaAs/GaAs Heterojunction Bipolar Transistors", IEEE Electronic Device Letters, vol. 10, No. 5, May 1989, pp. 200–202.

* cited by examiner

Primary Examiner—John F. Niebling
Assistant Examiner—Christopher Lattin
(74) Attorney, Agent, or Firm—A. Kate Huffman

(57) ABSTRACT

A method of manufacturing a semiconductor component and the component thereof includes forming a dielectric layer (620) over a portion of a passivation ledge (640) in an emitter layer (280) and overlapping a base contact (660) onto the dielectric layer (620).

12 Claims, 3 Drawing Sheets

US 6,368,929 B1

METHOD OF MANUFACTURING A SEMICONDUCTOR COMPONENT AND SEMICONDUCTOR COMPONENT THEREOF

FIELD OF THE INVENTION

The present invention pertains to methods of making semiconductor components and the components thereof, and more particularly to bipolar transistors.

BACKGROUND OF THE INVENTION

It is well known that bipolar transistors, especially heterojunction bipolar transistors (HBTs) based on GaAs technologies, can exhibit excessive current leakage at emitter/base contact junctions. See Lin, Hao-Hsiung et. Al., "Super-gain AlGaAs/GaAs Heterojunction Bipolar Transistors using an Emitter Edge-thinning design," Appl. Phys. Lett. 47 (8), Oct. 15 1985, pp. 839–841. Surface recombination of electrons in the base material and the spacing between the emitter and base contacts of the devices degrade transistor performance and affect device reliability.

The prior art has attempted to minimize the parasitic capacitance at these emitter/base junction areas by, for example, producing devices 10 on a substrate 26. An area between the emitter layer 34 and the base contacts 48 is covered with a photoresist material 50 prior to etching the device as described in U.S. Pat. No. 5,804,877 (Fuller et. al.) and illustrated in FIG. 1. The disadvantage of this method is the use of an additional photolithography step during the device fabrication process that causes damage to collector sidewalls during the stripping of the photoresist and limits the useful operating voltage of the transistor.

To address the surface recombination problem that reduces the reliability of the HBTs, a fabrication process described in U.S. Pat. No. 5,001,534 (Lunardi et. al.) required that an emitter layer (referred to as a ledge) be left intact beneath the entire base contact and electrical contact to the base layer of the device was accomplished through the intact emitter layer. The base contact metal was diffused through the emitter layer, and the reliability of the transistors were compromised.

In U.S. Pat. No. 5,840,612 (Oki et. al.) surface passivation of HBTs was again addressed by using a depleted layer of widebandgap semiconductor (also referred to as a ledge) over the extrinsic base region of the transistor. The ledge thickness was defined by selectively etching away semiconductor layers above the widebandgap semiconductor; however, it is difficult to achieve a consistent ledge thickness and thus large variations in the device's characteristics result.

As demand for more reliable device performance continues to increase, the need for semiconductors, especially HBTs based on GaAs technologies, which exhibit maximum operating voltages has become apparent.

Accordingly, a need exists for a method of manufacturing a semiconductor component, and a semiconductor component thereof, that is both reliable and exhibits maximum operating voltages.

BRIEF DESCRIPTION OF THE DRAWINGS

The present invention will be better understood from a reading of the following detailed description, taken in conjunction with the accompanying drawing figures in which.

Figure 1:
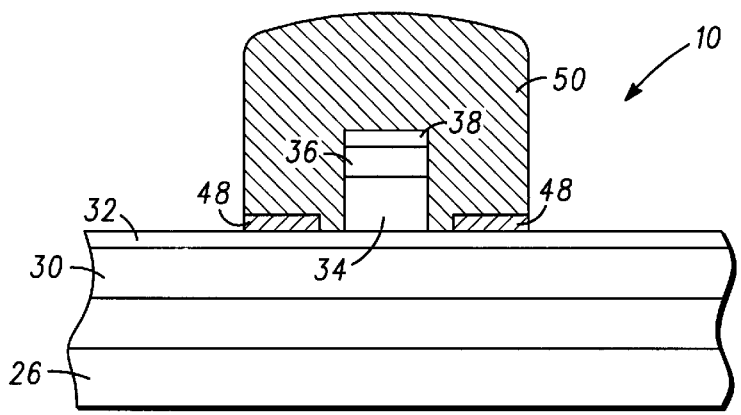
FIG. 1 is a cross-sectional view of a semiconductor component manufactured according to the prior art method described above.

For simplicity and clarity of illustration, the figures illustrate the general invention, and descriptions and details of well-known features and techniques are omitted to avoid excessive complexity. The figures are not necessarily drawn to scale, and the same reference numerals in different figures denote the same elements. It is further understood that the embodiments of the invention described herein are capable of being manufactured or operated in other orientations than described or illustrated herein.

DETAILED DESCRIPTION OF PREFERRED EMBODIMENTS

The present invention pertains to the fabrication of a semiconductor device, and in particular a heterojunction bipolar transistor, that eliminates the need for an additional photolithography step and thus avoids damage to the sidewalls of the collectors of the devices caused by photoresist stripping. The resulting devices reliably operate at voltages of up to about 30 volts.

Figure 2:
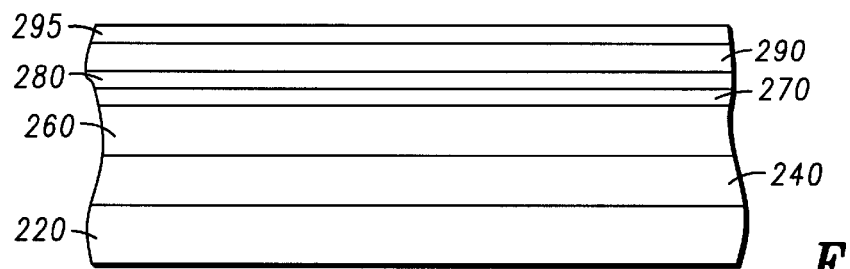
FIGS. 2–7 illustrate cross-sectional views of a semiconductor component during different stops of a manufacturing process in accordance with an embodiment of the invention.
Figure 3:
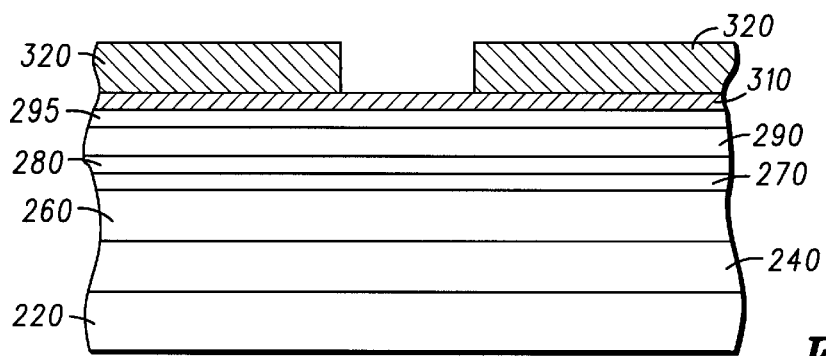

In a preferred embodiment of the invention, an emitter-up configuration is described, though one may appreciate that a collector-up transistor may be similarly fabricated. The material structure is illustrated in FIG. 2. The transistor is fabricated using an epitaxial layer structure on a substrate or wafer 220, such as for example silicon, or InP or GaAs (both semi-insulating substrates). The substrate 220 includes a subcollector layer 240, preferably a GaAs layer that is approximately 0.5 $\mu$m thickness and doped with Si, for example, to a concentration of approximately $3\times10^{18}$ cm$^{-3}$; a collector layer 260, preferably GaAs having a thickness of approximately 0.5 $\mu$m and doped with Si, for example, to a concentration of approximately $2.0\times10^{16}$ cm$^{-3}$; a base layer 270, preferably GaAs of approximately 0.08 $\mu$m in thickness and doped with carbon to a concentration of preferably approximately $4\times10^{19}$ cm$^{-3}$; an emitter layer 280, preferably of either AlGaAs or of GaInP, approximately 0.1 $\mu$m in thickness and doped with Si for example to a concentration of approximately $3\times10^{17}$ cm$^{-3}$; a buffer layer 290, preferably GaAs, approximately 0.15 $\mu$m in thickness and doped with Si, for example, to a concentration of approximately $3\times10^{18}$cm$^{-3}$; a transition layer 295 of approximately 0.05 $\mu$m in thickness and doped with Si, for example, to a concentration of approximately $3\times10^{18}$ cm$^{-3}$, with composition varying smoothly from GaAs to InGaAs, preferably In 0.5Ga0.5As; and an InGaAs cap layer 295 approximately 0.05 $\mu$m in thickness and doped with Si, for example, to a concentration of approximately $1\times10^{19}$ cm$^{-3}$. A TiWN layer 310 is sputter-deposited on the InGaAs layer 295, as shown in FIG. 3.

The emitter geometry is formed by lift-off techniques in which the emitter pattern is formed as openings in a photoresist few Photoresist 320 is spun to a thickness of approximately 1.2 $\mu$m followed by a track bake at about 100°C. for approximately 60 seconds. The wafer is then exposed in a stepper apparatus, and batch developed in a solution of 1:1, photoresist developer and water, for about 2 minutes. The exact conditions will vary with resist batch, as will the bakes, pattern exposure, and develop times for optimum resist sidewall profile also change. This process leaves a TiWN surface exposed in the desired location of the emitter contact, as shown in FIG. 3.

Figure 4:
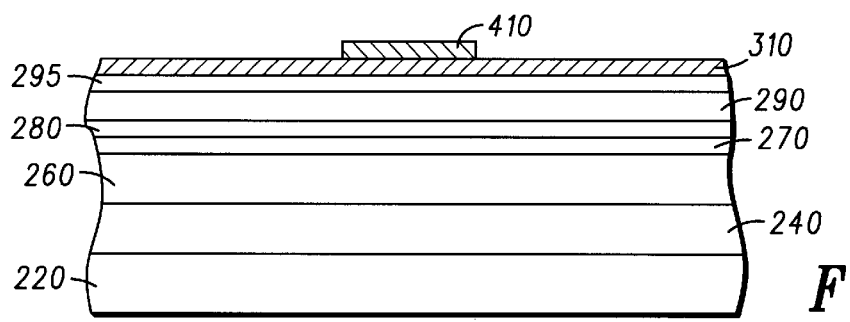

Following sequential evaporation of 0.05 μm Ti, 0.03 μm Pt, and 0.15 μm Au, the photoresist is lifted off in solvent, leaving the structure shown in FIG. 4. Typically, acetone is employed with soaks, ultrasonic agitation or spraying while the wafer is being spun. While the details of the lift-off process can adversely affect the patterning results, almost any process that leaves a debris-free surface is suitable. The resulting patterned metal 410 is used as a mask to etch the emitter geometry into the TiWN and then into the semiconductor underneath.

Figure 5:
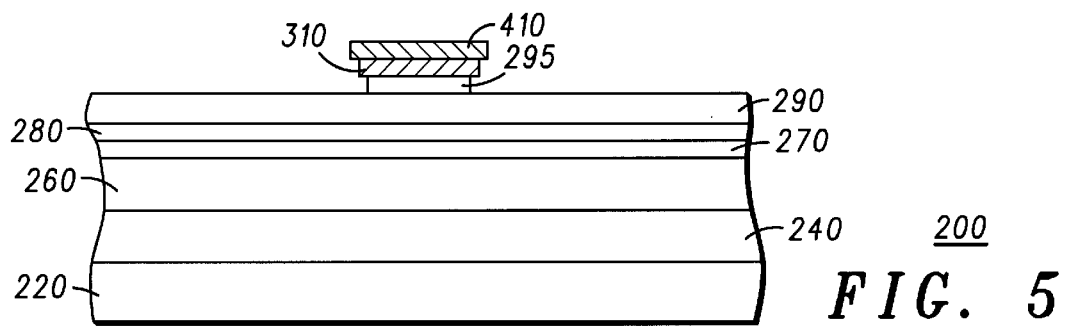

In order to form the emitter mesa of the transistor, a selective reactive ion etching (RIE)process is employed to etch through the TiWN 310, stopping on the InGaAs 295 surface; for example, CF4+8% O2 ⌊ 250 watts, 30 millitorr, 40° C., to a visible clearing of the TiWN layer 310 plus 50% over-etch. The InGaAs 295 is etched in a non selective, timed, wet etch (such as a 1:8:160 solution of H2SO4:H2O2:H2O for about 25 seconds) which results in the structure of FIG. 5. The GaAs buffer 290 is etched in a process that stops on the emitter layer 280. For an AlGaAs emitter, this can be achieved, for example, by RIE conditions of 80° C., 200 watts, 95 mT in gas flows of: 4.5% H2 in He, 20 sccm; CC14, 10 sccm; alternatively, BC13+SF6 can be used instead. For a GaInP emitter, such selective etching can be achieved, for example, using the aforementioned 1:8:160 solution of H2SO4:H2O2:H2O, which does not etch GaInP.

Figure 6:
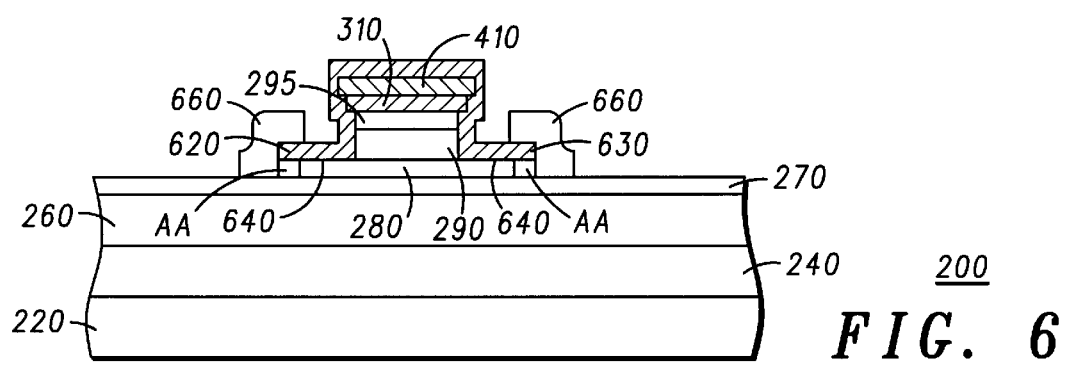

One or more dielectric layers are then deposited. In a first preferred embodiment, the dielectric layer 620 consists of silicon nitride, silicon dioxide or silicon oxynitride, most preferably silicon nitride. Photoresist is applied and patterned to define a region of the emitter layer 280 as a ledge region 640. The ledge region 640 surrounds the emitter mesa in order to reduce surface recombination of electrons. The dielectric layer is removed outside the ledge region 640 by a reactive ion etch process. The photoresist is then removed by acetone spray and ash. Subsequently the emitter layer 280 is removed outside the ledge region 640, for example, by wet chemical etching, to expose the base layer 270, preferably p+, while forming an undercut region (AA) with a lateral extent of approximately 0.1 um by removal of a portion of the emitter layer 280 under the dielectric layer. For an emitter layer 280 composed of AlGaAs, the aforementioned 1:8:160 solution of H2SO4:H2O2:H2O may be used for this etch; for a layer composed of GaInP, a 3:1 solution of H3PO4:HCl may be used. A photoresist pattern is made with a process similar to that described for the lift off patterned emitter contact geometry. This photoresist pattern overlaps the ledge region 640, so that the pattern exposes an area of the base layer 270 and an immediately adjacent area of the dielectric covering the ledge region 640. Ti—Pt—Au films, in thicknesses of 500, 300, and 1500 Angstroms are sequentially evaporated and lifted off to form a base contact 660. This base contact 660 lies directly on the base layer 270 adjacent to the ledge region 640, and also overlaps onto the dielectric layer 620 covering the ledge region 640. The undercut region (AA) separates the base contact 660 from the emitter layer 280 to prevent an undesirable electrical connection between the base contact 660 and the emitter layer 280. The structure, with the base contacts 660, is shown in FIG. 6.

A base mesa is etched through the base layer 270 and the collector layer 260 to expose the subcollector layer 240, preferably n+, using the overlapping base contact 660 and dielectric layer 620 in the ledge region 640 as an etch mask to minimize base collector capacitance. The base mesa etch process may use, for example, a 1:8:160 solution of H2SO4:H2O2:H2O with an etch time appropriate for the base layer 270 thickness plus the collector layer 260 thickness In a second preferred embodiment which utilizes a reactive ion etch process to form the base mesa instead of a wet chemical etch as was used in the first preferred embodiment, the dielectric layer 620 consists of sequentially-deposited silicon nitride; aluminum nitride; and silicon nitride, silicon dioxide or silicon oxynitride. This dielectric stack allows patterning of aluminum nitride while not requiring aluminum nitride to be in direct contact with semiconductor surfaces or photoresist, as such contact could cause undesirable interactions. Photoresist is applied and patterned to define a ledge region 640 surrounding the emitter mesa. The upper silicon nitride layer is removed by a reactive ion etch process to expose the aluminum nitride layer outside the ledge region 640. The photoresist is then removed by acetone spray and ash, and the exposed aluminum nitride is etched using the patterned silicon nitride layer as a mask. Aluminum nitride can be etched using alkaline solutions such as a 10:1 solution of H2O: NH4OH. The remaining exposed silicon nitride, both inside and outside the ledge region, is then removed by reactive ion etch. Although the described embodiments utilize silicon nitride and aluminum nitride, other dielectric materials, including but not limited to silicon dioxide, silicon oxynitride, and polyimide, may be employed instead of or in combination with silicon nitride and aluminum nitride. Processes similar to those described in the first preferred embodiment may be employed to remove the emitter layer 280 outside the ledge region 640, form undercut region (AA), and form a base contact 660 which overlaps onto the dielectric layer 620 covering the ledge region 640. A base mesa is etched through the base layer 270 and the collector layer 260 to expose the subcollector layer 240, preferably n+, using the overlapping base contact 660 and the dielectric layer 620 in the ledge region 640 as an etch mask to minimize base collector capacitance. The base mesa etch process may use, for example, a reactive ion etch with BC13+SF6, which etches GaAs with high selectivity with respect to aluminum nitride.

Figure 7:
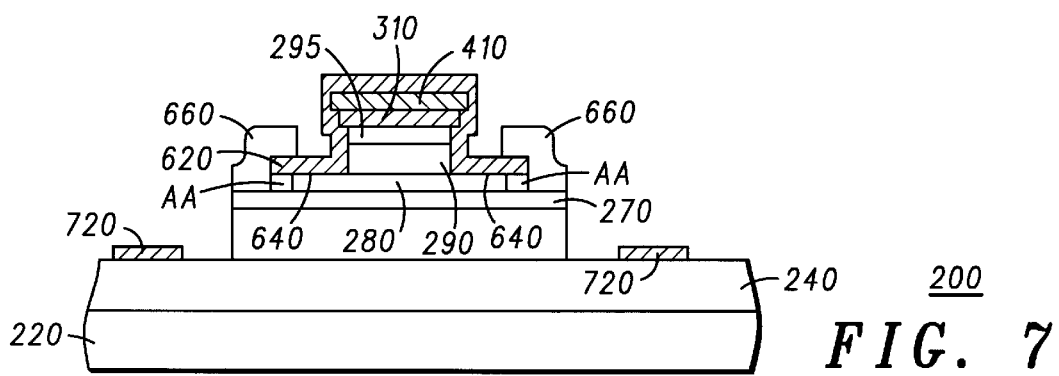
Figure 8:
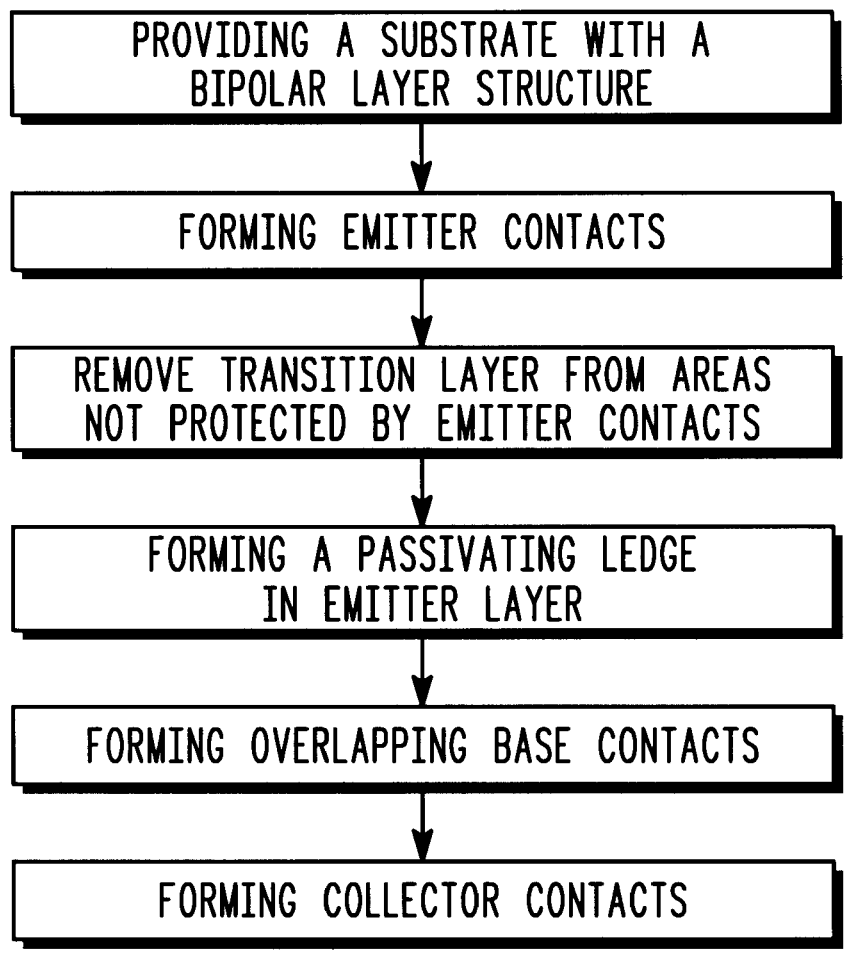
FIG. 8 is a flowchart of the preferred process according to the invention.

Collector contact 720 is formed using a photoresist liftoff process similar to that described for forming the emitter layer 280 and the base contacts 660. AuGe/Ni/Au contact metallization is evaporated over the photoresist-patterned wafer, and solvent lift-off is employed to remove the resist and the excess metal. Wafers are then ashed to remove the final organic residues. The resulting structure is shown in FIG. 7.

Electrical contacts and interconnections are made to emitter, base and collector regions. Interconnects are brought into these regions through vias in partially planarized dielectrics.

Therefore, an improved method of manufacturing a semiconductor component and the resulting component are provided to overcome the disadvantages of the prior art. The semiconductor components have more reliable performance and exhibit maximum operating voltages.

Although the invention has been described with reference to specific embodiments, it will be understood by those skilled in the art that various changes may be made without departing from the spirit or scope of the invention. For instance, the numerous details set forth herein such as, for example, material compositions, chemical concentrations, and layer thicknesses are provided to facilitate the understanding of the invention and are not provided to limit the scope of the invention. Accordingly, the disclosure of embodiments of the invention is intended to be illustrative of the scope of the invention and is not intended to be limiting. It is intended that the scope of the invention shall be limited only to the extent required by the appended claims.

We claim:

1. A method for fabricating a semiconductor component comprising:
   a) providing a material comprising a collector layer and a base layer over the collector layer;
   b) forming an emitter layer over a portion of the base layer;
   c) forming a layer of dielectric over at least a portion of a passivation ledge in the emitter layer;
   d) forming a base contact over a portion of the base layer and overlapping onto the dielectric layer, whereby an exposed portion of the base layer is formed adjacent the emitter layer and the base contact; and
   e) removing the exposed portion of the base layer using the base contact and the dielectric layer as a mask.

2. The method of claim 1 wherein the overlapping step further comprises overlapping the base contact onto the dielectric layer to substantially prevent exposure of the emitter layer and a base layer of the semiconductor component.

3. The method of claim 2 wherein the removing step further comprises: etching away a region of the base layer and a region of a collector layer to form boundaries that are substantially aligned to a first edge of the base contact that is remote from the emitter layer.

4. The method of claim 1 wherein the base layer is a p-type material.

5. The method of claim 1 wherein the dielectric material is selected from the group consisting of silicon nitride, aluminum nitride, silicon dioxide, silicon oxynitride and mixtures thereof.

6. A method of fabricating a bipolar transistor comprising:
   a) providing a material structure comprising a subcollector layer, a collector layer, a base layer deposited over the collector layer, and an emitter layer having a surface passivation ledge disposed on the base layer;
   b) forming a dielectric layer over the passivation ledge; and
   c) forming a base contact over a portion of the base layer and overlapping onto the dielectric layer, whereby an exposed portion of the base layer is formed adjacent the emitter layer and the base contact to form a bipolar transistor.

7. The method of claim 6 wherein the overlapping step further comprises overlapping the base contact onto the dielectric layer to substantially prevent exposure of the emitter layer and a base layer of the semiconductor component.

8. The method of claim 7 wherein the removing step further comprises: etching away a region of the base layer and a region of a collector layer to form boundaries that are substantially aligned to a first edge of the base contact that is remote from the emitter layer.

9. A method for fabricating a heterojunction bipolar transistor (HMT) comprising:
   a) providing a semiconductor device having a substrate layer, a subcollector layer, a collector layer, a base layer and an emitter layer, each layer formed on top of a preceding layer;
   b) etching the emitter layer to form an emitter mesa and a thin passivating ledge;
   c) forming a layer of dielectric over at least a portion of the thin passivating ledge;
   d) depositing a metal layer on the base layer and the passivating ledge to form base contacts that are self aligned with respect to the ledge, whereby an exposed portion of the base layer is formed adjacent the emitter layer and the base contact; and
   e) removing the exposed portion of the base layer using the base contact and the dielectric layer as a mask.

10. A method for fabrication of a semiconductor component comprising:
    a) providing a semiconductor substrate;
    b) forming a collector layer over the semiconductor substrate;
    c) forming a base layer over the collector layer;
    d) forming a emitter layer over a portion of the base layer;
    e) forming an emitter contact layer coupled to the emitter layer;
    f) forming a dielectric layer over the emitter layer and the emitter contact layer;
    g) removing a portion of the dielectric layer and a portion of the emitter layer which are disposed over the base layer to form an exposed surface of the base layer adjacent the emitter layer;
    h) forming a base contact over a portion of the base layer and overlapping onto the dielectric layer;
    i) removing the exposed surface of the base layer using the base contact and the dielectric layer as a mask to protect the emitter layer and the emitter contact layer; and
    j) forming a collector contact layer coupled to the collector layer.

11. The method of claim 10 wherein the step of removing a portion of the dielectric layer and a portion of the emitter layer further comprises over etching the portion of the emitter layer such that the emitter layer is undercut below the dielectric layer.

12. The method of claim 10 wherein the step of forming the base contact layer further comprises the base contact layer being spaced apart from the emitter layer.

* * * * *

UNITED STATES PATENT AND TRADEMARK OFFICE
CERTIFICATE OF CORRECTION

PATENT NO.     : 6,368,929 B1
DATED          : April 9, 2002
INVENTOR(S)    : Darrell G. Hill et al.

It is certified that error appears in the above-identified patent and that said Letters Patent is hereby corrected as shown below:

Column 6,
Line 2, change "(HMT)" to -- (HBT) --.

Signed and Sealed this

Eleventh Day of November, 2003

JAMES E. ROGAN
*Director of the United States Patent and Trademark Office*